(12) United States Patent
Chen et al.

(10) Patent No.: US 9,007,765 B2
(45) Date of Patent: Apr. 14, 2015

(54) SERVER SYSTEM AND METHOD FOR CONTROLLING THE SAME

(71) Applicants: Inventec (Pudong) Technology Corporation, Shanghai (CN); Inventec Corporation, Taipei (TW)

(72) Inventors: Chien-An Chen, Taipei (TW);
Chih-Chien Lin, Taipei (TW);
Kai-Yang Tung, Taipei (TW);
Hsueh-Hui Chang, Taipei (TW);
Hui-Min Feng, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 272 days.

(21) Appl. No.: 13/802,923

(22) Filed: Mar. 14, 2013

(65) Prior Publication Data
US 2014/0104784 A1   Apr. 17, 2014

(30) Foreign Application Priority Data
Oct. 12, 2012   (CN) .......................... 2012 1 0387679

(51) Int. Cl.
*H05K 7/20* (2006.01)
*G06F 1/20* (2006.01)

(52) U.S. Cl.
CPC ............ *G06F 1/206* (2013.01); *H05K 7/20736* (2013.01); *H05K 7/20836* (2013.01)

(58) Field of Classification Search
USPC ....................... 361/676–678, 679.46–679.54, 361/688–722, 752, 760, 831
See application file for complete search history.

(56) References Cited

U.S. PATENT DOCUMENTS

| | | | | |
|---|---|---|---|---|
| 7,319,594 B2* | 1/2008 | Nicolai et al. | ................ | 361/724 |
| 7,511,960 B2* | 3/2009 | Hillis et al. | .................... | 361/702 |
| 7,990,710 B2* | 8/2011 | Hellriegel et al. | ............ | 361/699 |
| 8,046,896 B2* | 11/2011 | Schmitt et al. | ................... | 29/469 |
| 2004/0264131 A1* | 12/2004 | Nishiyama et al. | ........... | 361/694 |
| 2008/0232064 A1* | 9/2008 | Sato et al. | ..................... | 361/687 |
| 2009/0198388 A1* | 8/2009 | Hillis | ............................ | 700/300 |
| 2011/0317357 A1* | 12/2011 | Sato et al. | ................ | 361/679.48 |
| 2012/0111533 A1* | 5/2012 | Chen et al. | ................... | 165/80.2 |

* cited by examiner

*Primary Examiner* — Courtney Smith
(74) *Attorney, Agent, or Firm* — Tim Tingkang Xia, Esq.; Morris, Manning & Martin, LLP

(57) ABSTRACT

A server system has an air inlet side and an air outlet side. The server system includes two server rack modules arranged side by side and a controller electrically connected to the server rack modules. Each server rack module includes a cabinet having a first side close to the air inlet side, multiple server hosts detachably disposed in the cabinet and a fan component. The fan component, disposed at the first side, includes multiple fans electrically connected to the controller. The first side of one of the cabinets abuts against the second side of the other cabinet. When the fan components operate, an air flow is formed in the cabinets. The server hosts are located in the flow path of the air flow. When one of the fans is failed, the controller is adapted for increasing a rotational speed of the fan component close to the air outlet side.

15 Claims, 5 Drawing Sheets

SERVER SYSTEM AND METHOD FOR CONTROLLING THE SAME

CROSS-REFERENCE TO RELATED APPLICATIONS

This non-provisional application claims priority under 35 U.S.C. §119(a) on Patent Application No(s). 201210387679.5 filed in China on Oct. 12, 2012, the entire contents of which are hereby incorporated by reference.

BACKGROUND OF THE INVENTION

1. Technical Field of the Invention

The disclosure relates to a server system and a method for controlling the same, and more particularly to a server system with cooling compensation and a method for controlling the same.

2. Description of the Related Art

Servers possess more powerful computing capability than personal computers (such as desktop computers and notebook computers) and are mostly applied to commercial, financial, even meteorological and military fields, and therefore require higher reliability and stability than personal computers do. Consequently, servers have stricter operating requirements on the software and hardware design than personal computers.

A common server is not only equipped with a heat dissipation device for dissipating heat in the server, but is also provided with a protection mechanism for protecting elements in the server against failure. When the heat dissipation efficiency of the heat dissipation device is not good enough, the operating temperature in the server may be higher than a preset threshold. Then, the system of the server will be automatically shut down unexpectedly, so as to prevent electronic elements in the server from failure due to an excessively high operating temperature. However, since servers are mostly deployed for commercial and financial purposes, unexpected shutdown of servers may lead to severe consequences. Therefore, how to improve the heat dissipation efficiency of the server is an objective pursued by developers.

SUMMARY OF THE INVENTION

An embodiment of the disclosure provides a server system having an air inlet side and an air outlet side opposite to each other. The server system comprises two server rack modules and a controller. The two server rack modules are arranged side by side. The controller is electrically connected to the two server rack modules. Each of the two server rack modules comprises a cabinet, a plurality of server hosts and a fan component. The cabinet has a first side and a second side opposite to each other, and the first side is closer to the air inlet side than the second side is. The plurality of server hosts are detachably disposed in the cabinet. The fan component, disposed at the first side of the cabinet, comprises a plurality of fans. The fans are respectively electrically connected to the controller. The first side of one of the two cabinets abuts against the second side of the other one of the two cabinets. When the two fan components are in operation, an air flow is formed in the two cabinets arranged side by side, and the air flow flows from the air inlet side toward the air outlet side of the server system. The plurality of server hosts are located in the flow path of the air flow. When at least one of the plurality of fans of the two fan components is failed, the controller increases a rotational speed of the fan component close to the air outlet side, thereby improving the heat dissipation efficiency of the server system.

An embodiment of the disclosure provides a method for controlling a server system, comprising the following steps. A server system is provided. The server system has an air inlet side and an air outlet side opposite to each other. The server system comprises two server rack modules and a controller. The two server rack modules are arranged side by side. The controller is electrically connected to the two server rack modules. Each of the server rack modules comprises a cabinet, a plurality of server hosts and a fan component. The cabinet has a first side and a second side opposite to each other. The first side is closer to the air inlet side than the second side is. The plurality of server hosts are detachably disposed in the cabinet. The fan component, disposed at the first side of the cabinet, comprises a plurality of fans. The plurality of fans are respectively electrically connected to the controller. The first side of one of the two cabinets abuts against the second side of the other one of the two cabinets. When the two fan components are in operation, an air flow is formed in the two side-by-side cabinets, and the air flow flows from the air inlet side toward the air outlet side of the server system. The server hosts are located in the flow path of the air flow. When at least one of the fans of the two fan components is failed, a rotational speed of the fan component close to the air outlet side by the controller is increased, thereby improving the heat dissipation efficiency of the server system.

BRIEF DESCRIPTION OF THE DRAWINGS

The disclosure will become more fully understood from the detailed description given herein below for illustration only, and thus does not limit the disclosure, wherein.

DETAILED DESCRIPTION

Figure 1:
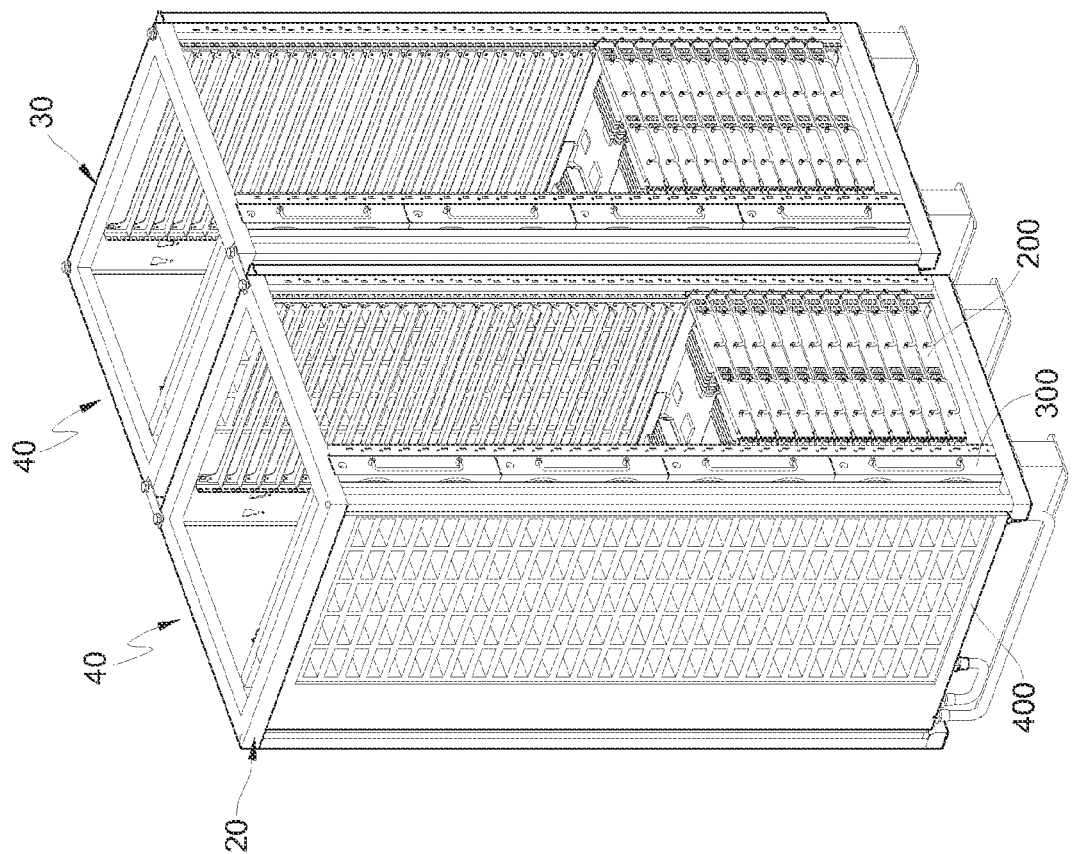
FIG. 1 is a schematic perspective view of a server system according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
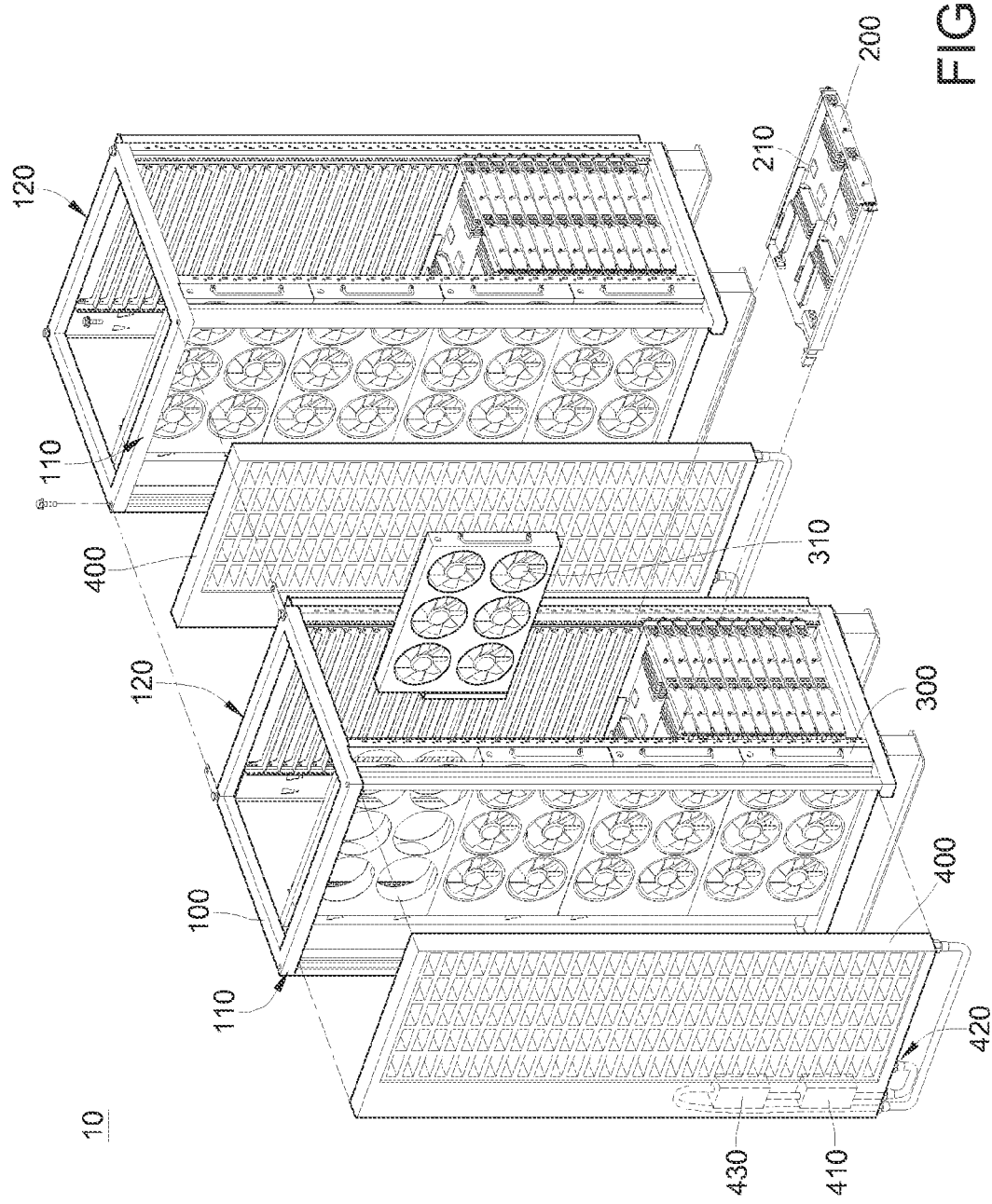
FIG. 2 is a schematic exploded view of the server system in FIG. 1.
Figure 3:
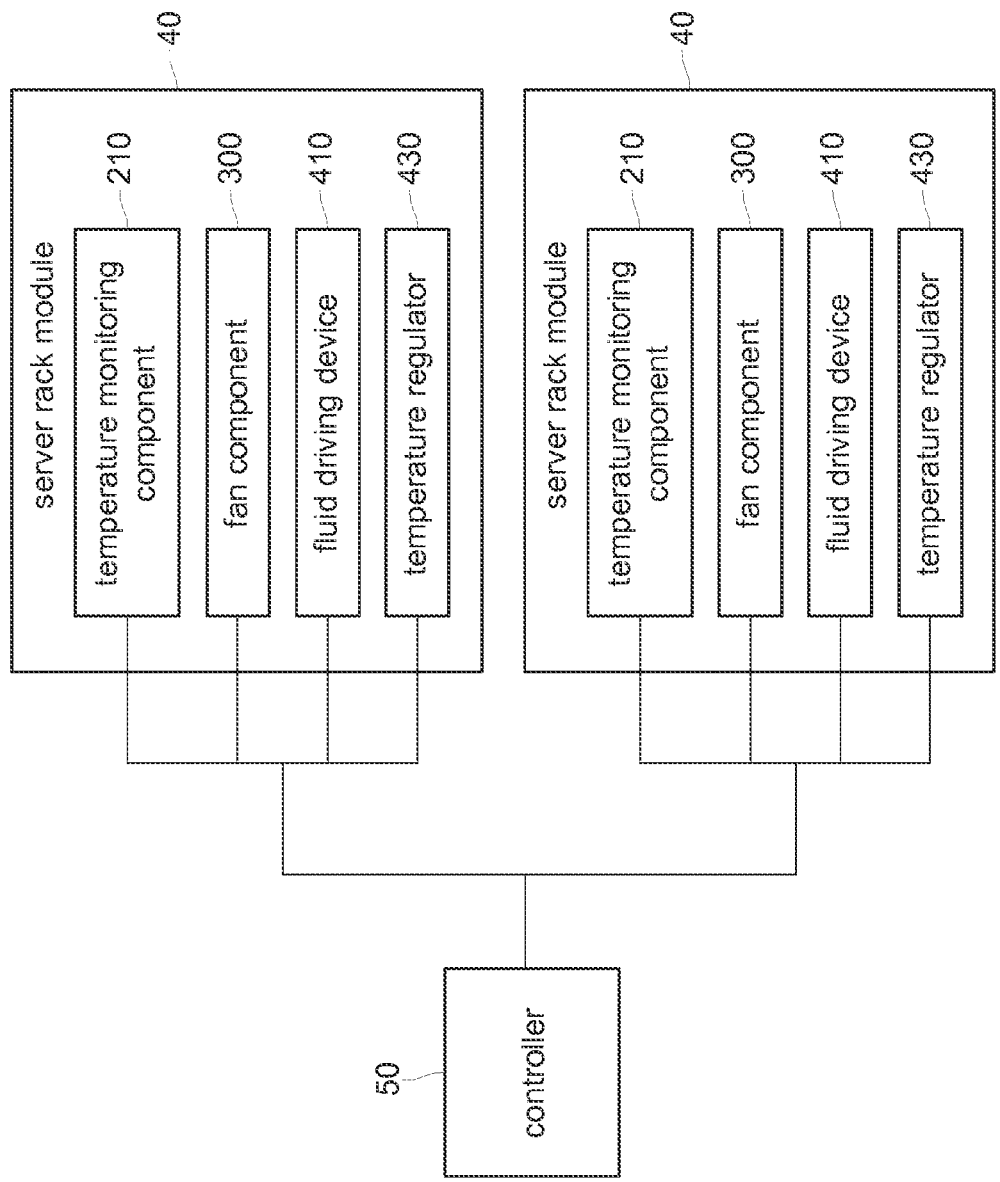
FIG. 3 is a block diagram of the electrical connection in the server system in FIG. 1.
Figure 4:
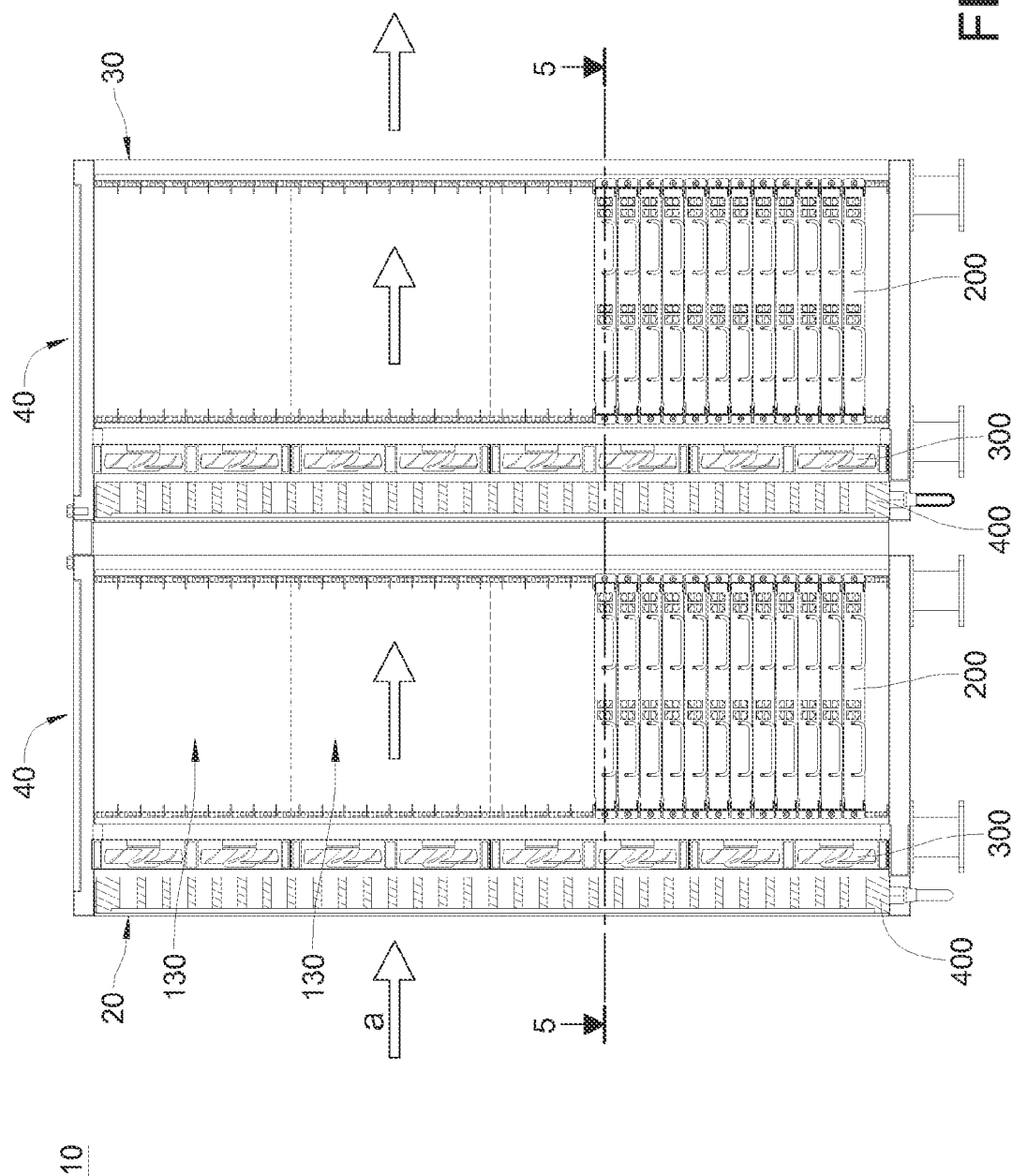
FIG. 4 is a schematic side view of the server system in FIG. 1.

Referring to FIGS. 1 to 4, FIG. 1 is a schematic perspective view of a server system according to an embodiment of the disclosure, FIG. 2 is a schematic exploded view of the server system in FIG. 1, FIG. 3 is a block diagram illustrating the electrical connection in the server system in FIG. 1, and FIG. 4 is a schematic side view of the server system in FIG. 1.

A server system 10 of this embodiment has an air inlet side 20 and an air outlet side 30 opposite to each other, that is, the air outlet side 30 is opposite to the air inlet side 20. The server system 10 comprises two server rack modules 40 and a controller 50. The two server rack modules 40 are arranged side by side. For convenient description, as an example, the number of the server rack modules 40 in this embodiment is two, but the disclosure is not limited thereto. In other embodiments, the number of the server rack modules 40 may be equaled to or greater than three.

Each of the server rack modules 40 comprises a cabinet 100, a plurality of server hosts 200 and a fan component 300. The cabinet 100 has a first side 110 and a second side 120 that is opposite to each other. The first side 110 of the cabinet 100 is closer to the air inlet side 20 than the second side 120 is. In other words, the distance between the first side 110 and the air inlet side 20 is less than that between the second side 120 and the air inlet side 20. In addition, the cabinet 100 has a plurality of storage regions 130 (as shown in FIG. 4). The storage regions 130 are respectively at a different height from the bottom of the cabinet 100. The server hosts 200 are detachably disposed in the storage regions 130 of the cabinet 100. The fan component 300, disposed at the first side 110 of the cabinet 100, comprises a plurality of fans 310. The plurality of fans 310 are respectively located in the storage regions 130. The first side 110 of one of the two cabinets 100 abuts against the second side 120 of the other one of the two cabinets 100. Typically, the first side 110 of the cabinet 100 away from the air inlet side 20 abuts against the second side 120 of the cabinet 100 that is close to the air inlet side 20, so that the two server rack modules 40 are arranged side by side. Moreover, the storage regions 130 at the same height of the two server rack modules 40 are in communication with each other.

Refer to FIGS. 2 and 4. As can be seen from the above description, each of the two server rack modules 40 of this embodiment is divided into a plurality of storage regions 130 at different heights. However, as for the heat dissipation effect, the plurality of fans 310 in the plurality of storage regions 130 at a same height exert the greatest influence on the plurality of server hosts 200 in the plurality of storage regions 130 that are at the same height. The influence of plurality of the fans 310 in the storage regions 130 at different heights on the above plurality of server hosts 200 is gradually weakened as the distance between the fan 310 and the increases. Therefore, the method for controlling the server system 10 is illustrated with respect to the plurality of storage regions 130 at one height. When the plurality of fans 310 in the plurality of storage regions 130 at the same height are in operation, the fans 310 in the plurality of storage regions 130 at the same height form an air flow in the two side-by-side cabinets 100. The air flow flows from the air inlet side 20 toward the air outlet side 30 of the server system 10 (along the direction denoted by the arrow a), and the plurality of server hosts 200 are located in the flow path of the air flow, so that heat generated by the plurality of server hosts 200 can be taken away.

However, when at least one fan 310 in the storage regions 130 at the same height is failed, the number of the plurality of fans 310 in operation in the storage region 130 at the same height is reduced, and accordingly, the overall heat dissipation efficiency of the plurality of fans 310 in the storage region 130 is reduced. If the overall heat dissipation efficiency is continuously reduced, the temperature of the plurality of server hosts 200 in the storage region 130 increases continuously, or even the server hosts 200 will break down, affecting users who are using the server system. Therefore, when at least one fan 310 in the plurality of storage regions 130 at the same height from each other is failed, the fan 310 transmits to a signal to the controller 50, and the signal indicates that the rotational speed of the fan 310 returns to zero or the fan 310 is abnormal. Then, the controller 50 starts to increase the rotational speed of the fans 310 that are at the same height of the failed fan 310 and that are closest to the air outlet side 30, thereby improving the heat dissipation efficiency of the server system 10. For example, a tachometer may be adapted for detecting whether a fan 310 is failed. When detecting that the rotational speed of a fan 310 decreases abnormally or returns to zero, the tachometer transmits a signal to the controller 50, and the signal indicates that the rotational speed of the fan returns to zero or the fan is abnormal. Moreover, fans with certain types may also directly provide a rotational speed signal or a fan abnormal signal for the controller 50 to use.

In this embodiment and other embodiments, if the heat dissipation efficiency of the server system 10 is still not effectively improved after the rotational speed of the fans 310 close to the air outlet side 30 is increased, the controller 50 further increases the rotational speed of the fans 310 in the storage regions 130, which are at the same height and closest to the air inlet side 20, thereby improving the heat dissipation efficiency of the server system 10.

The sequence of increasing the rotational speed of the fans 310 close to the air outlet side 30 first and then increasing the rotational speed of the fans 310 close to the air inlet side 20 is not intended to limit the disclosure. In some other embodiments, the rotational speed of the fans 310 close to the air inlet side 20 is increased first, and then the rotational speed of the fans 310 close to the air outlet side 30 is increased accordingly.

Furthermore, in this embodiment and other embodiments, if the heat dissipation efficiency of the server system 10 is still not effectively improved after the rotational speed of the fans 310 close to the air inlet side 30 is increased, the controller 50 further increases the rotational speed of the fans 310 in the storage regions 130 at different heights, thereby improving the heat dissipation efficiency of the server system 10. Typically, each of the plurality of server hosts 200 comprises at least one temperature monitoring component 210. The plurality of temperature monitoring components 210 are respectively electrically connected to the controller 50. The plurality of temperature monitoring components 210 are respectively adapted for monitoring the temperature of the plurality of server hosts 200. When the plurality of temperature monitoring components 210 detect that the temperature of one of the plurality of server hosts 200 is higher than a threshold, the corresponding temperature monitoring component 210 transmits a temperature abnormal signal of the server host 200 to the controller 50, to instruct the controller 50 to further increase the rotational speed of the plurality of fans 310 in the plurality of storage regions 130 at different heights, thereby improving the heat dissipation efficiency of the server system 10. The threshold is a temperature value which is set according to a safe temperature range allowing for normal operation of electronic elements in the server host 200.

Figure 5:
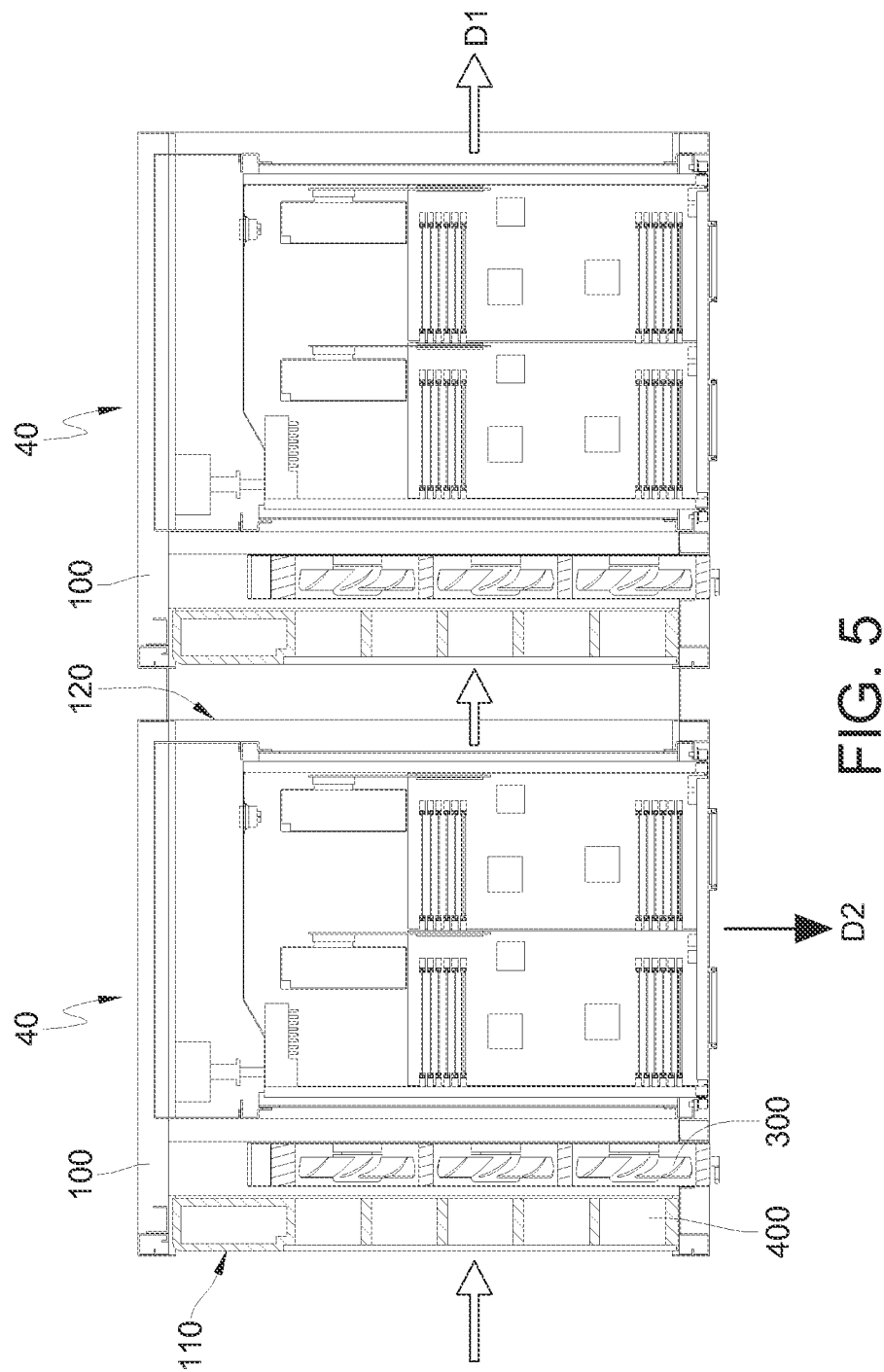
FIG. 5 is a schematic sectional view of the server system along a section line 5-5 in FIG. 4.

Referring to FIG. 5, which is a schematic sectional view of the server system along a section line 5-5 in FIG. 4. In this embodiment, each of the plurality of server hosts 200 of each of the two server rack modules 40 is adapted for being detached from the cabinet 100 along a first direction D1 away from the cabinet 100. The air flow flows from the first side 110 toward the second side 120 of the cabinet 100 along a second direction D2. In this embodiment, the first direction D1 is substantially perpendicular to the second direction D2. The term "substantially perpendicular" means that the angle formed between the first direction D1 and the second direction D2 is 90 degrees or approximately 90 degrees. Therefore, when the two server rack modules 40 are arranged side by side, the air flow may flow from the air inlet side 20 to the air outlet side 30 of the server system 10. Moreover, the server host 200 may be detached from the cabinet 100 freely.

In this embodiment and other embodiments, each of the two server rack modules 40 further comprises a cooling component 400. The cooling component 400 is disposed at the first side 110 of the cabinet 100, and the fan component 300 is located between the cooling component 400 and the plurality of server hosts 200. When the temperature monitoring components 210 detect that the temperature of one of the plurality of server hosts 200 is higher than the threshold, the corresponding temperature monitoring component 210 transmits a temperature abnormal signal of the server host 200 to the controller 50, so as to instruct the controller 50 to further reduce a cooling temperature of the cooling component 400 in the same server rack module 40, so as to lower the temperature of the air flow entering the cabinets 100.

Typically, each of the cooling components 400 comprises a fluid driving device 410, a cooling coil 420 and a temperature regulator 430. A cooling fluid is provided in the cooling coil 420, and the cooling coil 420 is in communication with the fluid driving device 410. The fluid driving device 410 is electrically connected to the controller 50 and is adapted for driving the cooling fluid to flow in the cooling coil 420. The temperature regulator 430 is electrically connected to the controller 50 and is in thermal contact with the cooling coil 420.

In this embodiment and other embodiments, when the temperature monitoring component 210 detects that the temperature of one of the plurality of server hosts 200 is higher than the threshold, the controller 50 is adapted for instructing the fluid driving device 410 in the same server rack module 40 to increase the flow rate of the cooling fluid in the cooling coil 420 close to the air inlet side 20, or the controller 50 is adapted for instructing the temperature regulator 430 in the same server rack module 40 to down-regulate (namely, to reduce or to decrease) the temperature of the cooling fluid in the cooling coil 420 close to the air inlet side 20, thereby improving the efficiency of heat exchange between the cooling component 400 and air.

It should be noted that, generally, when the fan component 300 guides air from outside the cabinet 100 into the cabinet 100, the outside air first performs heat exchange with the cooling component 400 so as to lower the temperature of the air flow entering the cabinet 100, and then the air flow performs heat exchanges with the server hosts 200 so as to lower the temperature of the plurality of server hosts 200. Furthermore, the controller 50 in this embodiment additionally increases the flow rate of the cooling fluid in the cooling component 400 or lowers the temperature of the cooling fluid in the cooling component 400, so that the temperature of the air flow which enters the cabinet 100 is lowered effectively, thereby improving the efficiency of heat exchange between the plurality of server hosts 200 and the air flow.

According to the server system and the method for controlling the same that are disclosed in the present disclosure, each of the server rack modules has a fan component, and the two server rack modules are arranged side by side. One of the two fan components is close to the air inlet side of the server system and the other one of the two fan components is close to the air outlet side of the server system. If a fan in the two fan components is failed, the controller increases the rotational speed of the fan component close to the air outlet side, thereby improving the heat dissipation efficiency of the server system.

Furthermore, each of the plurality of server rack modules has a cooling component, and since the two server rack modules are arranged side by side, one of the two cooling components is close to the air inlet side of the server system and the other one of the two cooling components is close to the air outlet side of the server system. If the temperature of the plurality of server hosts between the two cooling components is higher than the threshold, the controller lowers the temperature of the cooling component close to the air inlet side, so as to lower the temperature of the air flow entering the cabinet, thereby improving the efficiency of heat exchange between the air flow and the server hosts.

What is claimed is:

1. A server system, having an air inlet side and an air outlet side opposite to each other, the server system comprising two server rack modules and a controller, the two server rack modules being arranged side by side, the controller being electrically connected to the two server rack modules, and each of the two server rack modules comprising:
    a cabinet, having a first side and a second side opposite to each other, the first side being closer to the air inlet side than the second side is;
    a plurality of server hosts, detachably disposed in the cabinet; and
    a fan component, disposed at the first side of the cabinet, and the fan component comprising a plurality of fans, the fans being respectively electrically connected to the controller;
    wherein the first side of one of the two cabinets abuts against the second side of the other one of the two cabinets; when the two fan components are in operation, an air flow is formed in the two cabinets arranged side by side, the air flow flows from the air inlet side toward the air outlet side of the server system, and the plurality of server hosts are located in the flow path of the air flow; and when at least one of the plurality of fans of the two fan components is failed, the controller increases a rotational speed of the fan component close to the air outlet side, thereby improving the heat dissipation efficiency of the server system.

2. The server system according to claim 1, wherein each of the two cabinets has a plurality of storage regions, the plurality of storage regions are respectively located at a different height from the bottom of the cabinet, the plurality of server hosts and the plurality of fans are respectively located in the plurality of storage regions, and when at least one of the plurality of fans of the two fan components is failed, the controller increases a rotational speed of the fan component at the same height of the fan which is failed and is close to the air outlet side in the storage region, thereby improving the heat dissipation efficiency of the server system.

3. The server system according to claim 2, wherein when at least one of the plurality of fans of the two fan components is failed, the controller increases a rotational speed of the fan component at the same height and close to the air inlet side in the storage region, thereby improving the heat dissipation efficiency of the server system.

4. The server system according to claim 3, wherein each of the plurality of server hosts comprises at least one temperature monitoring component, the temperature monitoring component is electrically connected to the controller, and when the temperature monitoring component detects that a temperature of the server host is higher than a threshold, the controller increases a rotational speed of the fans in the storage regions at different heights.

5. The server system according to claim 4, wherein each of the two server rack modules further comprises a cooling component, the cooling component is disposed at the first side of the cabinet, and the fan component is located between the cooling component and the server hosts, and when the temperature monitoring component detects that the temperature of the server hosts close to the air inlet side is higher than the threshold, the controller down regulates a cooling temperature of the cooling component close to the air inlet side, so as to lower a temperature of the air flow entering the cabinets.

6. The server system according to claim 5, wherein each of the two cooling components comprises a cooling coil and a fluid driving device, a cooling fluid is provided in the cooling coil, the cooling coil is in communication with the fluid driving device, and the fluid driving device is electrically connected to the controller and drives the cooling fluid in the cooling coil to flow, and when the temperature monitoring component detects that the temperature of the plurality of server hosts, close to the air inlet side, is higher than the threshold, the controller instructs the fluid driving device that is close to the air inlet side to increase a flow rate of the cooling fluid in the cooling coil close to the air inlet side.

7. The server system according to claim 5, wherein each of the two cooling components further comprises a temperature regulator, the temperature regulator is in thermal contact with the cooling coil and electrically connected to the controller, and when the temperature monitoring component detects that the temperature of the plurality of server hosts close to the air inlet side is higher than the threshold, the controller instructs the temperature regulator that is close to the air inlet side to lower a temperature of the cooling fluid in the cooling coil close to the air inlet side.

8. The server system according to claim 1, wherein each of the plurality of server hosts of each of the two server rack modules is detached from the cabinet along a first direction away from the cabinet, and the air flow flows from the first side toward the second side of the cabinet along a second direction, and the first direction is substantially perpendicular to the second direction.

9. A method for controlling a server system, comprising:
providing a server system, the server system having an air inlet side and an air outlet side opposite to each other, the server system comprising two server rack modules and a controller, the two server rack modules being arranged side by side, the controller being electrically connected to the two server rack modules, and each of the server rack modules comprising:
a cabinet having a first side and a second side opposite to each other, the first side being closer to the air inlet side than the second side is;
a plurality of server hosts detachably disposed in the cabinet; and
a fan component disposed at the first side of the cabinet, and comprising a plurality of fans, the plurality of fans being respectively electrically connected to the controller;
wherein the first side of one of the two cabinets abuts against the second side of the other one of the two cabinets, and when the two fan components are in operation, an air flow is formed in the two side-by-side cabinets, the air flow flows from the air inlet side toward the air outlet side of the server system, and the server hosts are located in the flow path of the air flow; and
when at least one of the fans of the two fan components is failed, increasing a rotational speed of the fan component close to the air outlet side by the controller, thereby improving the heat dissipation efficiency of the server system.

10. The method for controlling the server system according to claim 9, wherein each of the cabinets has a plurality of storage regions, the plurality of storage regions are respectively located at a different height from the bottom of the cabinet, the plurality of server hosts and the plurality of fans are respectively located in the storage regions, and the step of increasing the rotational speed of the fan component close to the air outlet side by the controller further comprises:
increasing a rotational speed of the fan component that is located in the storage region at the same height and close to the air outlet side by the controller.

11. The method for controlling the server system according to claim 10, further comprising:
after increasing the rotational speed of the fan component that is located in the storage region at the same height and close to the air outlet side, increasing a rotational speed of the fan component that is located in the storage region at the same height and close to the air inlet side by the controller.

12. The method for controlling the server system according to claim 11, wherein each of the plurality of server hosts comprises at least one temperature monitoring component, the temperature monitoring component is electrically connected to the controller, and after the controller increases the rotational speed of the fan component that is located in the storage region at the same height and close to the air inlet side, if the temperature monitoring component still detects that a temperature of the server host is higher than a threshold, the controller increases a rotational speed of the plurality of fans in the plurality of storage regions at different heights.

13. The method for controlling the server system according to claim 12, wherein each of the two server rack modules further comprises a cooling component, the cooling component is disposed at the first side of the cabinet, and the fan component is located between the cooling component and the plurality of server hosts, and after the controller increases the rotational speed of the plurality of fans in the plurality of storage regions at different heights, if the temperature monitoring component still detects that the temperature of the plurality of server hosts, close to the air inlet side, is higher than the threshold, the controller down regulates a cooling temperature of the cooling component that is close to the air inlet side.

14. The method for controlling the server system according to claim 13, wherein each of the cooling components comprises a cooling coil and a fluid driving device, a cooling fluid is provided in the cooling coil, the cooling coil is in communication with the fluid driving device, and the fluid driving device is electrically connected to the controller and drives the cooling fluid in the cooling coil to flow, and after the controller down regulates the cooling temperature of the cooling component close to the air inlet side, if the temperature monitoring component still detects that the temperature of the plurality of server hosts close to the air inlet side is higher than the threshold, the controller instructs the fluid driving device close to the air inlet side so as to increase a flow rate of the cooling fluid in the cooling coil close to the air inlet side.

15. The method for controlling the server system according to claim 14, wherein each of the two cooling components further comprises a temperature regulator, the temperature regulator is in thermal contact with the cooling coil and electrically connected to the controller, and after the controller instructs the fluid driving device close to the air inlet side to increase the flow rate of the cooling fluid in the cooling coil close to the air inlet side, if the temperature monitoring component still detects that the temperature of the server hosts close to the air inlet side is higher than the threshold, the controller instructs the temperature regulator close to the air inlet side to lower a temperature of the cooling fluid in the cooling coil close to the air inlet side.

* * * * *